United States Patent
Condorelli et al.

(10) Patent No.: US 7,402,442 B2
(45) Date of Patent: Jul. 22, 2008

(54) PHYSICALLY HIGHLY SECURE MULTI-CHIP ASSEMBLY

(75) Inventors: Vincenzo Condorelli, Poughkeepsie, NY (US); Claudius Feger, Poughkeepsie, NY (US); Kevin C. Gotze, Poughkeepsie, NY (US); Nihad Hadzic, Wappingers Falls, NY (US); John U. Knickerbocker, Wappingers Falls, NY (US); Edmund J. Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/314,272

(22) Filed: Dec. 21, 2005

(65) Prior Publication Data

US 2007/0138657 A1    Jun. 21, 2007

(51) Int. Cl.
*H01L 23/58* (2006.01)
*H01L 21/00* (2006.01)
*B23Q 15/00* (2006.01)

(52) U.S. Cl. .................... 438/5; 257/700; 257/723; 257/777; 257/E23.169; 257/E23.174; 257/E23.178; 257/665; 29/709; 29/712; 29/740

(58) Field of Classification Search ................ 257/664, 257/665, 685, 686, 688, 723, 726, 734, 735, 257/772–786, E23.169–E23.178, E25.031, 257/E25.032, E23.01–E23.079; 29/64, 709, 29/712, 740
See application file for complete search history.

(56) References Cited

U.S. PATENT DOCUMENTS

| 4,407,007 | A | * | 9/1983 | Desai et al. ............... 257/697 |
|---|---|---|---|---|
| 4,764,804 | A | | 8/1988 | Sahara et al. |
| 4,994,735 | A | * | 2/1991 | Leedy .................... 324/754 |
| 5,010,389 | A | | 4/1991 | Gansauge et al. |
| 5,110,664 | A | * | 5/1992 | Nakanishi et al. ....... 428/195.1 |
| 5,306,866 | A | | 4/1994 | Gruber et al. |

(Continued)

FOREIGN PATENT DOCUMENTS

EP    095900    11/1999

(Continued)

OTHER PUBLICATIONS

Spielberger, R.K., et al., "Silicon-on-Silicon Packaging," IEEE Transactions on Components, Hybrids, and Manufacturing Technology, vol. 7, Issue 2, pp. 193-196, Jun. 1984.

(Continued)

*Primary Examiner*—Jasmine J Clark
(74) *Attorney, Agent, or Firm*—Lawrence D. Cutter; Stephen Bongini; Fleit Kain Gibbons Gutman Bongini & Bianco P.L.

(57) ABSTRACT

A physically secure processing assembly is provided that includes dies mounted on a substrate so as to sandwich the electrical contacts of the dies between the dies and the substrate. The substrate is provided with substrate contacts and conductive pathways that are electrically coupled to the die contacts and extend through the substrate. Electrical conductors surround the conductive pathways. A monitoring circuit detects a break in continuity of one or more of the electrical conductors, and preferably renders the assembly inoperable. Preferably, an epoxy encapsulation is provided to prevent probing tools from being able to reach the die or substrate contacts.

7 Claims, 4 Drawing Sheets

U.S. PATENT DOCUMENTS

| | | | |
|---|---|---|---|
| 5,424,573 | A | 6/1995 | Kato et al. |
| 5,608,262 | A | 3/1997 | Degani et al. |
| 5,717,229 | A * | 2/1998 | Zhu ................ 257/208 |
| 5,804,004 | A | 9/1998 | Tuckerman et al. |
| 5,953,213 | A | 9/1999 | Napierala |
| 6,026,221 | A * | 2/2000 | Ellison et al. ............. 700/121 |
| 6,150,124 | A | 11/2000 | Riedel |
| 6,268,660 | B1 | 7/2001 | Dhong et al. |
| 6,301,121 | B1 * | 10/2001 | Lin ................ 361/783 |
| 6,369,444 | B1 | 4/2002 | Degani et al. |
| 6,500,699 | B1 | 12/2002 | Birdsley et al. |
| 6,579,743 | B2 | 6/2003 | Clevenger et al. |
| 6,620,647 | B2 | 9/2003 | Kroner |
| 6,844,631 | B2 * | 1/2005 | Yong et al. ............. 257/786 |
| 6,861,858 | B2 * | 3/2005 | Chen et al. ............. 324/755 |
| 6,992,896 | B2 * | 1/2006 | Fraley et al. ............. 361/719 |
| 7,105,933 | B2 * | 9/2006 | Haza et al. ............. 257/786 |
| 2003/0015709 | A1 | 1/2003 | Emrick et al. |
| 2004/0075170 | A1 | 4/2004 | Degani et al. |

FOREIGN PATENT DOCUMENTS

| | | | | |
|---|---|---|---|---|
| JP | 05-090559 | * | 9/1991 | ............. 257/723 |
| JP | 6045514 | | 2/1994 | |
| JP | 11345932 | | 11/1999 | |
| JP | 11067919 | | 7/2001 | |

OTHER PUBLICATIONS

Ketchan, M.B., "High-Level Discretionary Wiring for Wafer Scale Integration," IBM Technical Disclosure Bulletin, vol. 30, No. 5, Oct. 1987.

Stephansen, S., et al., "Low Cost, High Performance Silicon-on-Silicon Multichip Modules," Wescon/90, Conference Record, Nov. 13-15, 1990, Anaheim, California.

Frye, Robert C., et al., "Silicon-on-Silicon MCMs with Integrated Passive Components," IEEE Multi-Chip Module Conference, Santa Cruz, California, Mar. 18-20, 1992, MCMC-92 Proceedings, pp. 155-158.

Day, Ray-Long, et al., "A Silicon-on-Silicon Multichip Module Technology with Integrated Bipolar Components in the Substrate," IEEE Multi-Chip Module Conference, Santa Cruz, CA., Mar. 15-17, 1994, MCMC-94 Proceedings, pp. 64-67.

Contreras, J.L., Silicon Substrate Multichip Modules for Innovative Products (SUMMIT)—Developments in an EC Funded Project, EuPac '98: European Conference on Electronic Packaging Technology, $3^{rd}$, and International Conference on Interconnection Technology in Electronics, $9^{th}$, Nuremberg, Jun. 15-17, 1998, Lectures and Poster Show Contributions, pp. 122-126.

Degani, Y., et al., "A Novel MCM Package for RF Applications," IEEE/CPMT International Electronics Manufacturing Technology Symposium, $23^{rd}$, Austin, Oct. 19-21, 1998, Proceedings, pp. 225-231.

Kanbach, H., et al., "3D Si-on-Si Stack Package," International Conference on High Density Packaging and MCMs, Denver, Apr. 6-9, 1999 (Proceedings of SPIE, vol. 3830), pp. 248-253.

Barton, J., et al., "Reliability Evaluation of a Silicon-on-Silicon MCM-D Package," ISSN 0026-2714, vol. 41, No. 6, pp. 779-932, Jun. 2001.

* cited by examiner

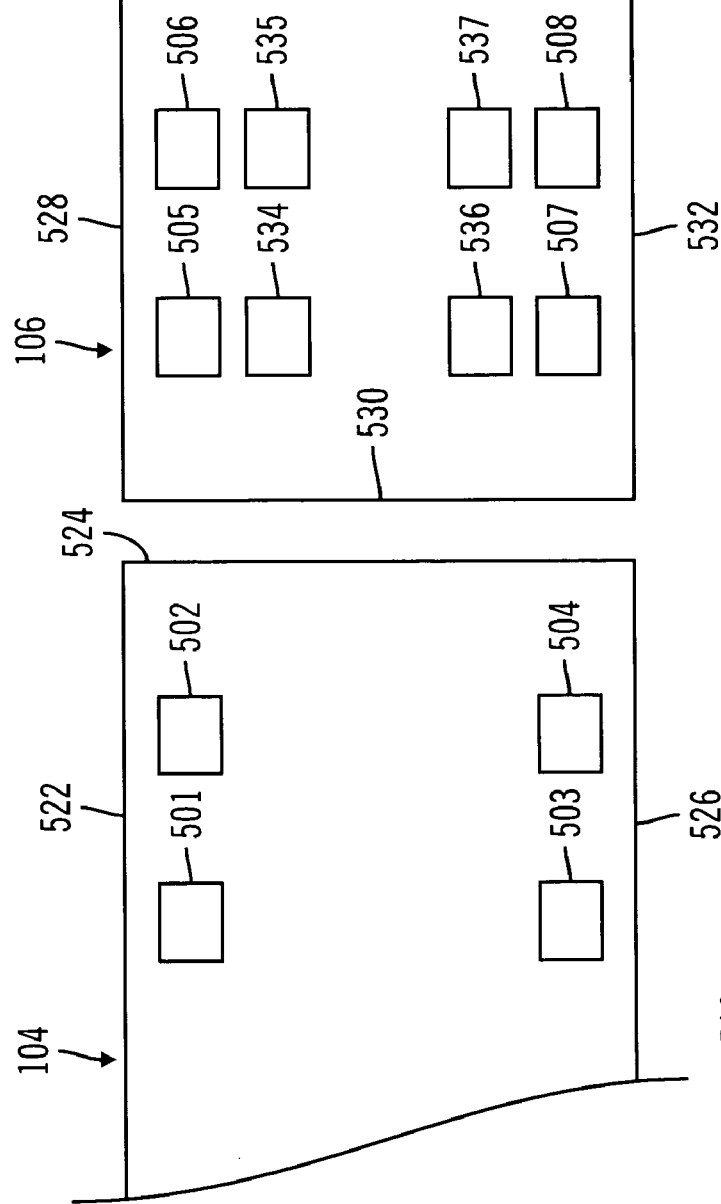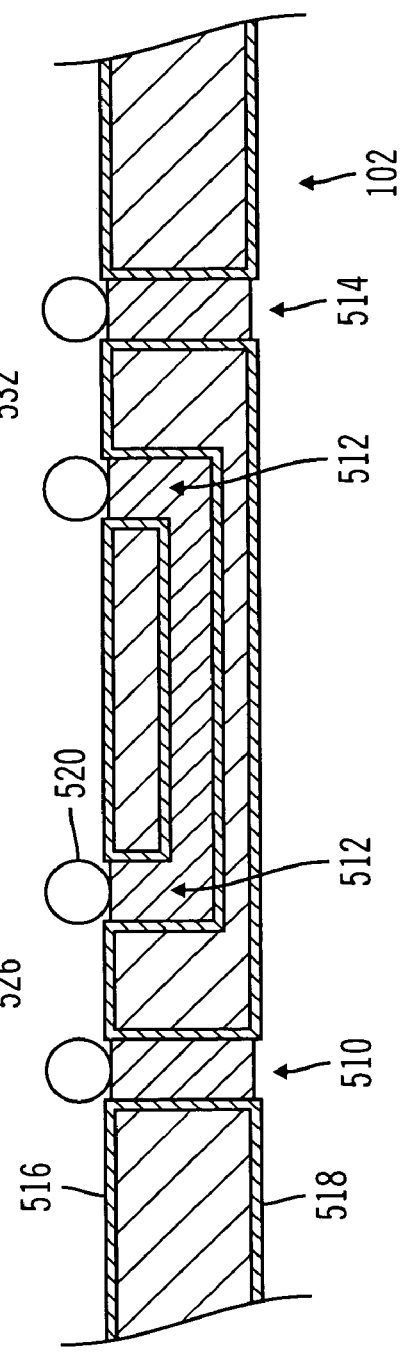

000
PHYSICALLY HIGHLY SECURE MULTI-CHIP ASSEMBLY

FIELD OF THE INVENTION

The present invention relates, in general to integrated circuits, and more particularly relates to computing modules that are physically highly secure against reverse engineering.

BACKGROUND OF THE INVENTION

Prevention of reverse engineering and data theft is an important consideration at all levels of computer architecture design. To protect their IP investments, designers currently utilize two main approaches to achieve a physically highly secure computing module. Such a "Highly Secure" computing module is suitable for NIST's FIPS 140-2 level 4 certification for cryptographic modules. The first approach to achieve a physically highly secure computing module is to embody the entirety of a function into a single semiconductor chip whose dimensions are so small that it makes physically probing or optically determining secret information infeasible. The second approach to achieve security is to enclose a set of semiconductor devices (such as a CPU, ASIC, FPGA, DRAM, and SRAM) inside a tamper detecting envelope which fully encloses those devices, and which causes all sensitive information in the system to be destroyed upon penetration.

A common problem with building a single chip solution is that often a single chip is too small to fit an entire complex system design in an economic fashion. Additionally, because of the limits of semiconductor process technologies, all of the semiconductor devices that may be needed in the system may not be able to be fabricated in a single semiconductor manufacturing process.

While an enclosed multi-chip solution alleviates some of the problems of the single chip solution, the use of a fully-enclosed envelope introduces a new set of challenges. Often these envelopes (and their associated packaging materials) are highly thermally insulative, and thus limit the amount of power that can be consumed inside the device and transmitted through the envelope as heat. The strict power budget required for such designs often detrimentally impacts the overall performance of the device. Additionally, because the envelope materials must be as sensitive as possible to potential probing attempts, the reliability problems associated with false positive tampers is significant.

SUMMARY OF THE INVENTION

One embodiment of the present invention provides a physically secure substrate assembly that includes a substrate, electrical conductors located on and/or in the substrate, at least one conductive pathway connecting at least two of the electrical conductors, and at least one set of electrical contacts for detecting a break in continuity of at least one of the electrical conductors.

Another embodiment of the present invention provides a secure processing assembly that includes a substrate having a first planar surface and a second planar surface, a first die having electrical contacts on a first surface, a second die having electrical contacts on a first surface, a first conductive pathway connected to at least one of the electrical contacts of the first die, a second conductive pathway connected to at least one of the electrical contacts of the second die, electrical conductors surrounding at least part of the first and second conductive pathways, and a monitoring circuit coupled to the electrical conductors. The first die is mounted on the first planar surface of the substrate such that the electrical contacts of the first die are located between the first surface of the first die and the first planar surface of the substrate. The second die is mounted on the first planar surface of the substrate such that the electrical contacts of the second die are located between the first surface of the second die and the first planar surface of the substrate. At least a portion of the first conductive pathway is located within the substrate, at least a portion of the second conductive pathway is located within the substrate. The monitoring circuit detects a break in continuity of one or more of the electrical conductors.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

FIGS. 5A and 5B are views of the dies and substrate of FIG. 1.

DETAILED DESCRIPTION OF PREFERRED EMBODIMENTS

Figure 1:
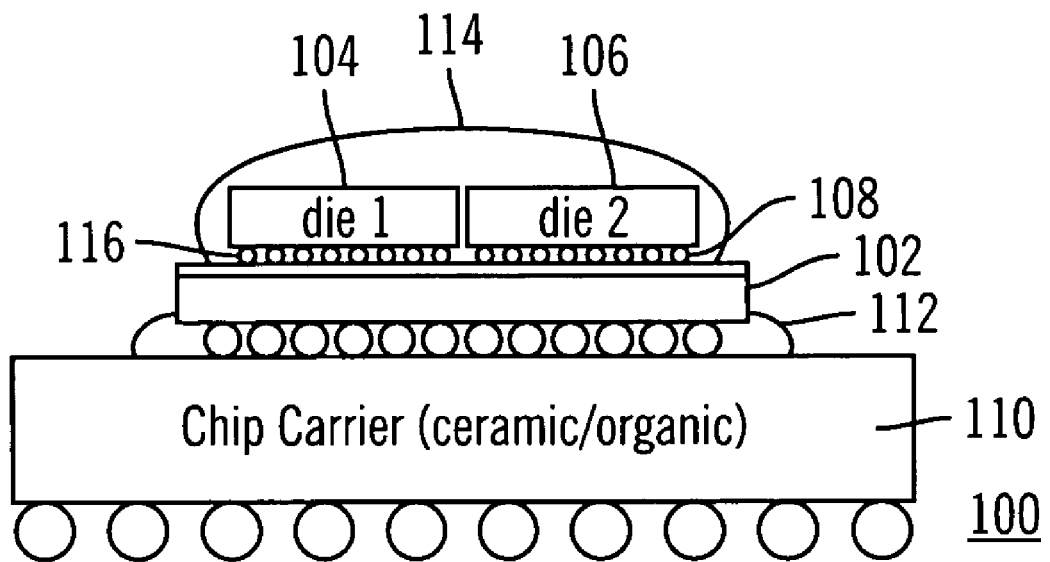
FIG. 1 is a block diagram illustrating a side view of a physically highly secure multi-chip module according to an embodiment of the present invention.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The present invention, according to a preferred embodiment, provides a physically highly secure multi-chip module without the limitations, such as high temperatures, limited power budgets, and temperamental tamper countermeasures, associated with a conventional secure envelope.

In accordance with the principles of the present invention, one embodiment provides a physically-highly-secure multi-chip module that makes use of silicon on silicon technology. Specifically, in the context of multi-chip solutions to IP security, flip-chip silicon dies are mounted directly on a silicon substrate in a way that renders reverse engineering and data theft virtually impossible.

Cryptography is used to provide data security for sensitive data. Cryptography embodies principles, means and methods for the transformation of data to hide its information content, prevent its undetected modification, and prevent its unauthorized use. Cryptography pertains to the transformation of ordinary text into a coded form (ciphertext) by encryption and transformation of ciphertext back into the plaintext by decryption.

One current standard for the protection of sensitive data is the National Institute of Standards and Technology's (NIST) Federal Information Processing Standard (FIPS) 140-2 Security Requirements for Cryptographic Modules. The standard is applicable to all Federal agencies that use cryptographic-based security systems to protect sensitive information in computer and telecommunication systems (including voice systems) as defined in Section 5131 of the Information Technology Management Reform Act of 1996, Public Law 104-106. This standard must be followed in designing and implementing cryptographic modules that Federal departments and agencies operate, or are operated for them, under contract. The standard is also followed by some private and commercial organizations.

One of the key requirements of the FIPS 140-2 standard is physical security. In multi-chip devices, one major physical security weakness resides in the ability to reverse engineer (i.e., discover the inner-workings of the device or capture data) by probing the interconnections between chips. Preferred embodiments of the present invention render the interconnections un-probable by mounting flip-chip silicon dies directly on a silicon substrate. In this configuration, the connections are sandwiched between the die and substrate so as to be hidden. Preferred embodiments of the present invention utilize materials and techniques to ensure that the multi-chip device cannot be disassembled without rendering it useless.

Referring now to FIG. 1, a multi-chip computing module 100 according to an embodiment of the present invention is shown. The module 100 includes a silicon substrate 102, which, at a minimum, functions to implement the chip inter-connections and the connectivity to the outside world. The silicon substrate 102 can be manufactured by using a conventional "Back End of Line" (BEOL) process. Blank wafers skip the standard chemical and lithographic steps that produce transistor structures and go straight to BEOL steps to produce metal layers. The metal layers are formed on the silicon substrate so as to form configurations that range from simple direct inter-connections between multiple chips that are directly attached to the silicon substrate 102, to complicated mesh-type grids.

Figure 2:
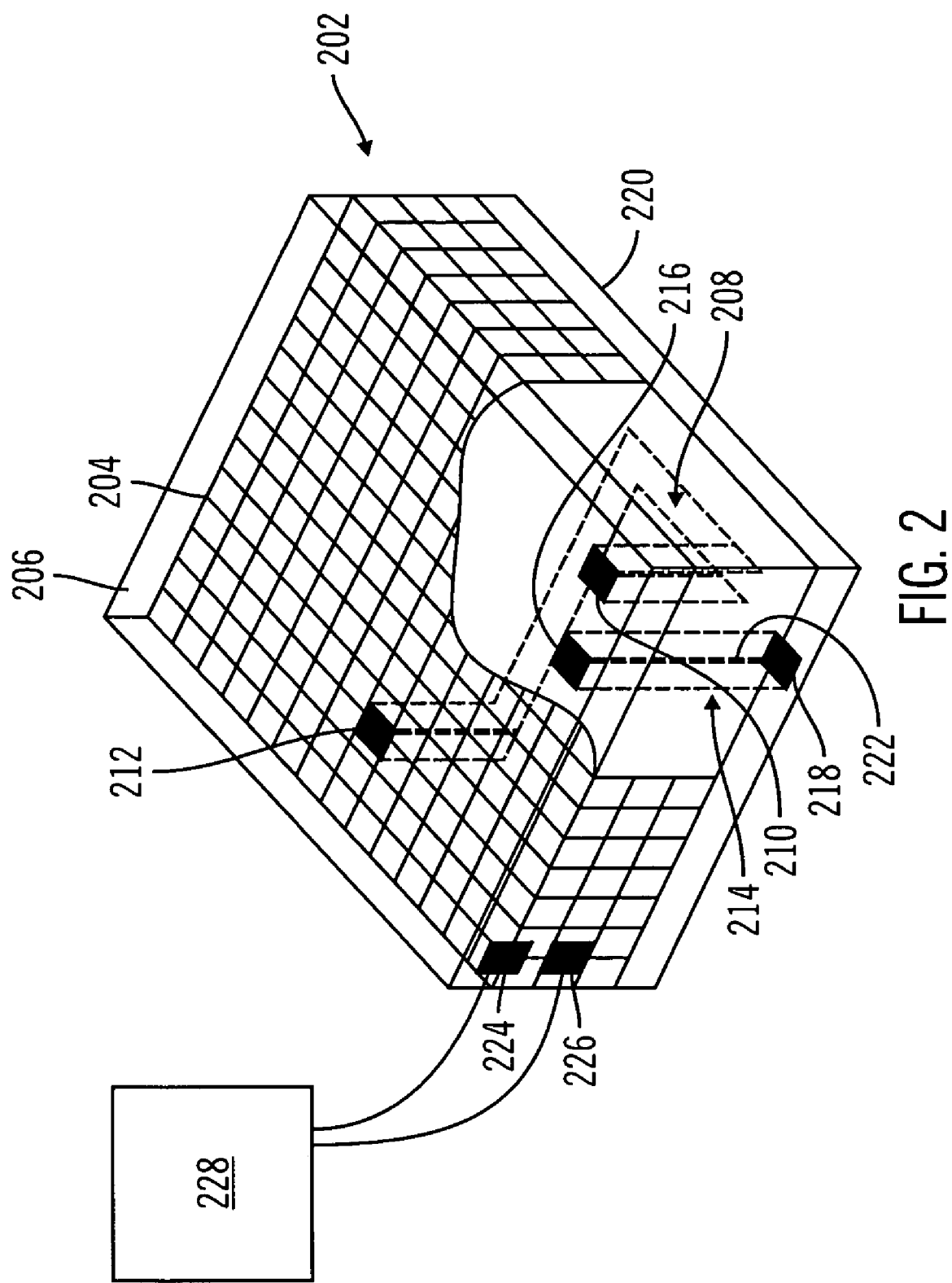
FIG. 2 is an isometric view of a silicon substrate assembly according to an embodiment of the present invention.

FIG. 2 shows a more detailed view of a substrate 202 that includes a mesh-type grid of electrical conductors 204 according to one embodiment of the present invention. The grid 204 can be provided on or near an outer surface 206 of the substrate 202. In this embodiment, the electrical conductors weave in and out of each other. In other embodiments, the conductors are simply provided in a crisscross pattern. In still other embodiments, the conductors are arranged so that all conductors are aligned in the same direction and in substantially parallel lines. The conductors 204 can be enclosed in silicon oxide to insulate the conductors 204 from the silicon substrate and from each other.

The mesh-type grid of FIG. 2 provides the advantage of protecting the interior of the substrate from the introduction of probing instruments. If the conductors are arranged so that the spaces in the grid 204 are sufficiently small, a probing instrument will not be able to fit between the conductors and will cause a discontinuity to occur in the grid when one of the conductors is contacted or broken. Monitoring circuitry can be used to detect these discontinuities and respond in a way that prevents characterization of the module (such as by deleting memories, zeroing out registers, or creating false readings).

The monitoring circuit 228 can be implemented in a variety of ways. In one embodiment, the substrate is provided with contacts 224 and 226 that allow continuity testing of one or more of the conductors by an external circuit 228. There can be a set of contacts for each conductor, one set of contacts coupled to all conductors, or a subset of the conductors coupled to each contact.

The monitoring circuit is provided within one or more of the dies, the substrate 102, the chip carrier 110, external to the assembly, or a combination thereof. A discontinuity can be detected by any of a set of well-known established electrical tests. These tests include resistance measurements, current measurements, voltage measurements, and combinations thereof.

Figure 4:
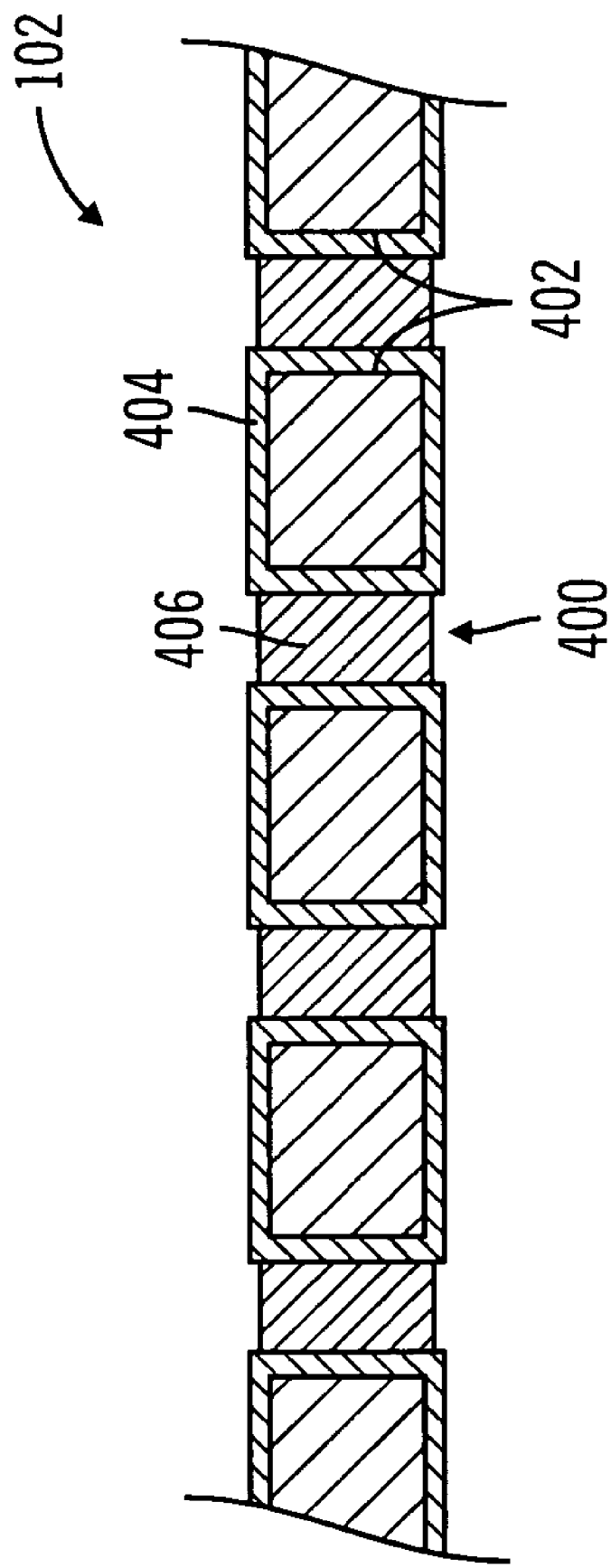
FIG. 4 is a partial cross-sectional view of a substrate having through vias according to an embodiment of the present invention.

FIG. 4 shows a substrate with vias according to one embodiment of the present invention. Vias are electrically conductive pathways that travel through the silicon substrate. Vias can pass all the way through the silicon substrate 102 or just through a certain number of layers. Therefore, vias make it possible for a component attached to a surface of the substrate to communicate with other components attached to the same surface or any other surface of the substrate.

Exemplary vias 400 are shown in FIG. 4. A pathway through the silicon substrate 102 is created by a drilling process that opens up one or more holes or channels penetrating from one surface of the substrate to an opposite surface. Once the drilling process is completed, the entire silicon substrate 102 and inner surface area of the channels are covered with a barrier 404 which insulates the substrate from the soon-to-be-applied conductive material and prevents it from diffusing into the silicon substrate 102. In one embodiment, the insulating barrier 404 is silicon nitrate and is deposited utilizing chemical vapor deposition (CVD). The barrier 404 prevents the conductive material placed in the channels from reacting with the silicon, which is highly reactive with other metals. It also serves to prevent the silicon from acting as a conducting material during operation of the semiconductor circuit.

A metallic substance 406, which serves as the conductive material, is placed in the channels. In one embodiment, the metallic substance 406 is copper and is placed utilizing physical vapor deposition. Electroplating can alternatively be utilized to fill the channels with the metallic substance. As in conventional electroplating, excess material is deposited on the surface of the wafer and is polished off utilizing chemical mechanical polishing (CMP).

Those of ordinary skill in the art are familiar with the processes involved in the deposition of conductive material into channels in the silicon substrate. Any fabrication methods can be used in accordance with the present invention.

A via 214 is shown in FIG. 2. The via 214 begins at a first contact pad 216 on an upper surface 206 of silicon substrate 102 and ends at a second contact pad 218 on a lower surface 220 of silicon substrate 102 via conductive pathway 222, which penetrates the entire height of the substrate 102. Also shown in FIG. 2 is a second type of via 208, which provides electrical communication between components located on the same surface 206 of the substrate 102. The second type of via 208 begins at a first contact pad 210 on the upper surface 206 of the substrate 102 and travels down through the mesh 204 and into the interior area of the substrate 102. The via 208 then travels to a more central location within the substrate and re-emerges from the mesh 204 to terminate at a second contact pad 212 on the same upper surface 206 as the first contact pad 210.

In further embodiments of the present invention, the silicon substrate 102 is used to provide other electrical components and functionalities, such as built-in decoupling capacitors, resistor bridges, and other active and passive circuits.

The substrate 102, with vias 208 and 214 and mesh 204, is produced by a well-defined and simplified manufacturing process, and, therefore, results in few manufacturing defects. This architecture is economically advantageous because it is possible to produce a substrate which is larger than typical chips at a price that is less than, or equal to, a smaller conventional chip. More specifically, on a normal chip that includes transistors, the bulk of chip defects are caused in the smallest structures on the device (i.e., transistors and the smallest wires). Because a silicon substrate only includes relatively larger metal structures, it is much less likely to have defects. Thus, its yield should be high and manufacturing costs low.

Referring now back to FIG. 1, two dies 104 and 106 are shown located on top of the substrate 102. The dies 104 and 106 are mounted in a "flip-chip" arrangement and attached to the substrate 102. A "flip-chip" attachment permits the bonding of an integrated circuit chip directly to the substrate contacts without the need for wires there between. In this embodiment, flip-chip attachment is accomplished by employing a conductive material, such as conductive paste or solder "microballs" 108. The chips 104 and 106 are "flipped," that is, turned upside down, so that die electrical contact pads on the chip's surface are aligned with the pads on the substrate 102.

Small amounts of the electrically conductive material 108 (i.e., the microballs) are disposed between the electrical contact pads of the chip and the pads on the substrate such that there is electrical communication there between. The multi-chip computing module 100 is thereupon subjected to elevated temperature and pressure to convert the conductive material 108 to a composite to make the attachment permanent. Ideally, the materials are chosen so that the components can never be separated without destroying a functional portion of the module. Preferably, this material will be a transient liquid, such as tin and lead. The tin has a low melting point and combines with the lead. After the combination occurs, the materials must be subjected to very high temperatures to reach the melting point of the lead in order to separate the two.

In one embodiment, the electrically conductive material 108 is not necessary. In this embodiment, the bonding between the dies and the substrate is a direct bonding between metals, such as copper-to-copper bonding. In this embodiment, each of the contact terminals is made at least partially from copper. The components are subjected to temperatures of about 400° C. and pressures of about 100 psi. The copper surfaces experience "grain growth" where the outer electrons in their valence shells combine to form a permanent bond. The single copper junction can then not be separated without subjecting the junction to temperatures of about 1,083° C. (the melting point of copper). At this temperature, the components will be destroyed before the copper contacts separate.

Looking now to FIG. 5A, the flip-chip arrangement is further illustrated. In FIG. 5A, the dies 104 and 106 are seen from a partial bottom view. From the bottom view, four electrical contacts can be seen on each of the dies 104 and 106. Die 104 has electrical contacts 501-504 and die 106 has electrical contacts 505-508. Die 106 also has an additional set of contacts 534-537.

FIG. 5B shows an edge view of the exemplary substrate 102. The substrate is provided with three vias 510, 512, and 514. Vias 510 and 514 create conductive pathways that extend completely through the substrate 102 from a first planar surface 516 of the substrate to a second planar surface 518 of the substrate. Via 512 extends from a first location on the first planar surface 516 that lines up with electrical contact 502 of the first die 104, through a portion of the substrate below the first planar surface 516, and to a second location on the first planar surface 516 that lines up with electrical contact 505 of the second die 106. Via 512 places the two dies 104 and 106 in electrical communication with each other.

When the dies 104 and 106 are rotated ("flipped") and placed on top of the substrate 102, electrical contact 501 is aligned with via 510, electrical contact 502 aligned with via 512, electrical contact 505 aligned with a second side of via 512, and electrical contact 506 aligned with via 514. Solder microballs 520 or other types of electrically conductive paste are disposed between the electrical contacts of the dies and the pads on the substrate such that there is electrical communication there between. The assembly is then subjected to elevated temperature and pressure to convert the microballs 520 to a composite to make the attachment permanent.

In this embodiment, as can be seen from the bottom view of the dies 104 and 106 in FIG. 5A, the electrical contacts 501-508 are advantageously spaced away from the edges 522, 524, 526 and 528, 530, 532, respectively, of the dies 104 and 106. Thus, when the dies are in their flipped position and attached to the substrate, inserting a measuring instrument between the die and substrate so as to probe the contacts becomes exceedingly difficult.

Referring now back to FIG. 1, to add further security to the device, an epoxy or other adhesive material 114 is used to encapsulate the dies 104 and 106. The epoxy encapsulation includes an epoxy underfill 116 which adds further difficulty to probing the microbumps 108 or interconnection balls with a measurement probe. Additionally, the epoxy encapsulation 114 and 116 makes it infeasible to remove the chips 104 and 106 without destroying them.

Further security is achieved in this embodiment by making the dies sufficiently thin so that that separation from the other components will result in fracturing of the thin pieces. For instance, the substrate 102 is, in one embodiment, between about 50-150 microns thick. Typically, the dies are about 730 microns thick, but in some embodiments, are only about 350 microns thick.

The above-described structure is effectively as physically secure as a single chip because all of the structures in the device are on the scale of those of a single chip, and disassembly of the system without destroying it is effectively impossible. Probing the microbumps which connect the chips to the substrate will be very difficult because of the sheer size of the microbumps, the opportunity to use area array interconnection, adjacent placement of the chips, and the opportunity to stack or use 3-D silicon.

In the embodiment shown in FIG. 1, the silicon substrate 102 is situated on top of a chip carrier 110. The chip carrier 110 attaches to the silicon substrate 102 and places the silicon substrate 102 in electrical communication with other devices attached to the chip carrier 110. Similar to the flip-chip/substrate method of attachment, the silicon substrate 102 is attached to the chip carrier through a plurality of solder microballs 112 that couple electrical contact pads of the two components 102 and 110. This type of attachment is known in the art as a ball grid array (BGA).

It is also possible to add further protection by placing the electrical contacts in rows, as shown in FIG. 5. Die 106 is provided with a set of die electrical contacts 534-537 that are surrounded by the set of die electrical contacts 505-508. With this type of architecture, the microbumps in the outer, more easily probed row 505-508, can be used to carry non-sensitive information or are only power/ground connections. In other embodiments, the chips can be designed to cause sensitive information default if the chips are compromised or probed. Known monitoring circuits can be used to affect the default.

Figure 3:
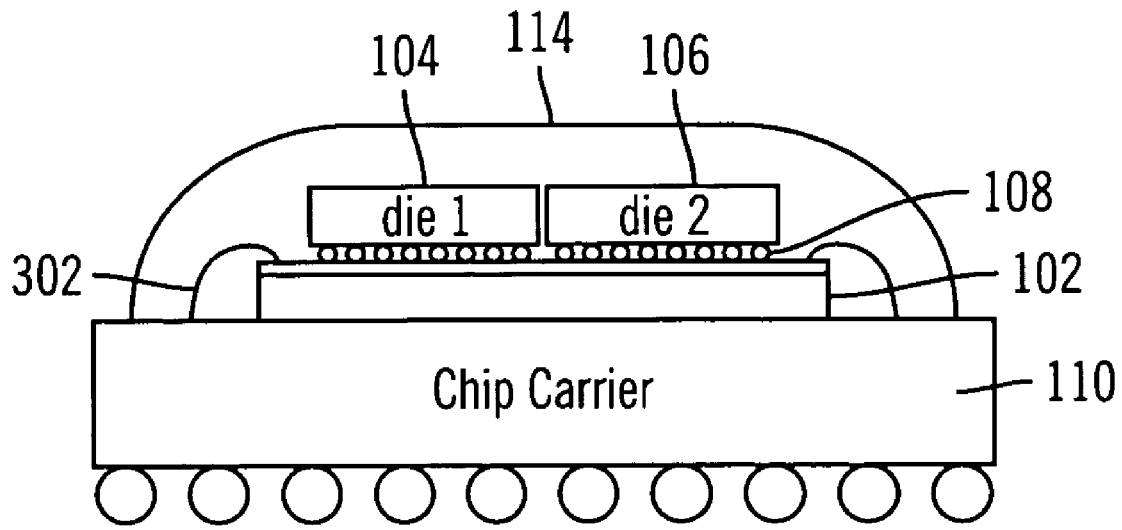
FIG. 3 is a block diagram illustrating a side view of the physically highly secure multi-chip module of FIG. 1 with the silicon substrate wire bonded to the chip carrier.

Referring now to FIG. 3, another embodiment of the present invention is shown. In the embodiment of FIG. 3, the silicon substrate 102 of FIG. 1 is bonded to a chip carrier 110, but not through the use of microballs as previously described. In the embodiment of FIG. 3, another attachment technique is used, such as epoxy, adhesives, hardware, or other methods to bond the silicon substrate 102 to the chip carrier 110. Wire leads 302 provide conductive pathways from an upper surface of the silicon substrate 102, which, in this embodiment, include the component's contacts, to the chip carrier 110 below. An epoxy material is then placed over the wire leads 302 to form an encapsulation 114 to protect the leads from damage and environmental conditions. If the information carried by the leads 302 needs to be protected from monitoring, as do the contacts between the dies and substrate, the leads 320 and epoxy 114 are appropriately chosen so that removal of the epoxy will damage the leads and render the module inoperable.

Accordingly, the present invention allows manufacturers to build physically highly secure modules with multiple chips, which may be custom designed or commodity and built on standard logic, DRAM, Flash, analog or another process technology, without having to submit to the limitations associated with using a secure envelope such as high temperatures, limited power budgets, and temperamental tamper countermeasures.

The terms "a" or "an", as used herein, are defined as one, or more than one. The term "plurality", as used herein, is defined as two, or more than two. The term "another", as used herein, is defined as at least a second or more. The terms "including" and "having", as used herein, are defined as comprising (i.e., open language). The term "coupled", as used herein, is defined as connected, although not necessarily directly, and not necessarily mechanically.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method for providing a physically secure multi-chip assembly, the method comprising the steps of:

mounting a first die on a first planar surface of a substrate such that electrical contacts on a first surface of the first die are located between the first surface of the first die and the first planar surface of the substrate;

mounting a second die on the first planar surface of the substrate such that electrical contacts on a first surface of the second die are located between the first surface of the second die and the first planar surface of the substrate;

providing a first conductive pathway that is connected to at least one of the electrical contacts of the first die, at least a portion of the first conductive pathway being located within the substrate;

providing a second conductive pathway that is connected to at least one of the electrical contacts of the second die, at least a portion of the second conductive pathway being located within the substrate;

providing a plurality of electrical conductors that surround at least part of the first and second conductive pathways; and detecting a break in continuity of one or more of the electrical conductors.

2. The method according to claim 1, wherein the first conductive pathway extends through the substrate from the first planar surface to a second planar surface of the substrate.

3. The method according to claim 1, wherein the step of mounting the first die comprises disposing an adhesive material between the substrate and the first die so as to permanently attach the first die to the substrate.

4. The method according to claim 1, further comprising the step of encapsulating the first and second dies in an epoxy material.

5. The method according to claim 1, further comprising the step of erasing at least a portion of a memory upon the detection of the break in continuity.

6. The method according to claim 1, wherein at least a portion of the electrical conductors is located between the first planar surface and a second planar surface of the substrates.

7. The method according to claim 1, further comprising the step of electrically coupling a chip carrier to at least one of the first conductive pathway and the second conductive pathway at a second planar surface of the substrate.

* * * * *